United States Patent
Marra et al.

(10) Patent No.: US 8,824,967 B2
(45) Date of Patent: Sep. 2, 2014

(54) DYNAMICALLY CHANGING A TRANSMITTER SAMPLING FREQUENCY FOR A DIGITAL-TO-ANALOG CONVERTER (DAC) TO REDUCE INTERFERENCE FROM DAC IMAGES

(75) Inventors: Thomas D. Marra, San Diego, CA (US); Soon-Seng Lau, San Diego, CA (US); Inyup Kang, San Diego, CA (US); Arash Mirbagheri, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 484 days.

(21) Appl. No.: 12/823,668

(22) Filed: Jun. 25, 2010

(65) Prior Publication Data
US 2011/0044380 A1   Feb. 24, 2011

Related U.S. Application Data

(60) Provisional application No. 61/220,959, filed on Jun. 26, 2009.

(51) Int. Cl.
| | |
|---|---|
| *H04B 1/00* | (2006.01) |
| *H04B 1/52* | (2006.01) |
| *H04B 1/04* | (2006.01) |
| *H03M 1/66* | (2006.01) |

(52) U.S. Cl.
CPC .............. *H04B 1/525* (2013.01); *H04B 1/0475* (2013.01); *H03M 1/661* (2013.01)
USPC ...................... 455/63.1; 455/67.11

(58) Field of Classification Search
CPC ....... H04L 1/0001; H04L 1/0026; H04L 1/20; H04L 2209/80; H04B 2001/7152; H04B 15/02; H04B 17/042; H04B 1/406; H04B 7/15542; H04W 24/00; H04W 52/04; H04W 52/60; H04W 72/04; H04W 72/1231
USPC ............... 455/552.1, 63.1, 114.2, 278.1, 296; 370/331; 375/144, 148, 346
See application file for complete search history.

(56) References Cited

U.S. PATENT DOCUMENTS

| | | | | |
|---|---|---|---|---|
| 6,043,767 A | * | 3/2000 | Wakamatsu | ................... 341/139 |
| 2005/0265428 A1 | * | 12/2005 | McCorkle | ..................... 375/130 |

(Continued)

FOREIGN PATENT DOCUMENTS

| | | |
|---|---|---|
| CN | 1805297 A | 7/2006 |
| JP | 2008113183 A | 5/2008 |

OTHER PUBLICATIONS

Taiwan Search Report—TW099121076—TIPO—Nov. 24, 2013.

(Continued)

*Primary Examiner* — Golam Sorowar
(74) *Attorney, Agent, or Firm* — Jeffrey D. Jacobs

(57) ABSTRACT

A method for interference reduction is described. The method is implemented in a wireless device. It is determined that a page is going to be received via a secondary receiver. It is also determined that a digital-to-analog converter (DAC) image from a transmitter will cause interference with the secondary receiver when the page is received. A sampling frequency of the DAC for the transmitter is changed so that there are not any DAC images from the transmitter that will cause interference with the secondary receiver.

35 Claims, 13 Drawing Sheets

(56) References Cited

U.S. PATENT DOCUMENTS

2006/0256119 A1* 11/2006 Xiu et al. ................. 345/520
2008/0117876 A1* 5/2008 Hidaka et al. ............. 370/331
2008/0219331 A1* 9/2008 Liang et al. ............... 375/219
2008/0316076 A1* 12/2008 Dent et al. ................ 341/144

OTHER PUBLICATIONS

International Search Report and Written Opinion—PCT/US2010/040111, International Search Authority—European Patent Office—Oct. 1, 2010.

* cited by examiner

DYNAMICALLY CHANGING A TRANSMITTER SAMPLING FREQUENCY FOR A DIGITAL-TO-ANALOG CONVERTER (DAC) TO REDUCE INTERFERENCE FROM DAC IMAGES

RELATED APPLICATIONS

This application is related to and claims priority from U.S. Provisional Patent Application Ser. No. 61/220,959 filed Jun. 26, 2009, for "DYNAMIC TRANSMITTER SAMPLING RATE CHANGE MECHANISM FOR SIMULTANEOUS HYBRID DUAL RECEIVE DIGITAL-TO-ANALOG CONVERTER (DAC) IMAGE DESENSITIZATION MITIGATION."

TECHNICAL FIELD

The present disclosure relates generally to wireless communication systems. More specifically, the present disclosure relates to systems and methods for dynamically changing a transmitter sampling frequency for a digital-to-analog converter (DAC) to reduce interference from DAC images.

BACKGROUND

Wireless devices have become smaller and more powerful in order to meet consumer needs and to improve portability and convenience. Consumers have become dependent upon wireless devices such as cellular telephones, personal digital assistants (PDAs), laptop computers and the like. Consumers have come to expect reliable service, expanded areas of coverage and increased functionality.

A wireless device may be capable of communicating using multiple wireless communication standards. A wireless device may be capable of communicating using a wireless local area network (WLAN), Bluetooth, cellular and Global Positioning System (GPS). In some instances, a wireless device may communicate using multiple wireless standards concurrently. For example, a Bluetooth stereo headset may receive music from a computer while the computer downloads songs from an Internet website using a wireless local area network (WLAN).

Transmissions sent by the wireless device may interfere with communications received by the wireless device or communications received by other wireless devices. For example, a digital-to-analog converter (DAC) may introduce DAC images into transmissions, which fall on or near the frequencies used by receivers for receiving. These DAC images may cause interference. Large and high-powered filters can remove some of the DAC images, but at a high cost.

SUMMARY

A method for interference reduction is described. The method is implemented in a wireless device. It is determined that a page is going to be received via a secondary receiver. It also determined that a digital-to-analog converter (DAC) image from a transmitter will cause interference with the secondary receiver when the page is received. A sampling frequency of the DAC for the transmitter is changed so that there are not any DAC images from the transmitter that will cause interference with the secondary receiver.

The transmitter may be an EV-DO (Evolution Data Optimized) transmitter. The secondary receiver may be a CDMA2000 receiver. The method may be performed when the wireless device is in the middle of an EV-DO (Evolution Data Optimized) data session call. A primary receiver may be used for the EV-DO data session call. The primary receiver may be connected to a primary antenna and the secondary receiver may be connected to a secondary antenna.

The transmitter may be capable of transmitting in multiple frequency bands. The primary receiver may be capable of receiving in multiple frequency bands. The secondary receiver may be capable of receiving pages in multiple frequency bands. The page may be a CDMA2000 page. The secondary receiver may know what frequency is going to be used to receive the CDMA2000 page prior to receiving the CDMA2000 page. The DAC image may cause interference with the secondary receiver by falling on a CDMA2000 receiver paging channel.

The sampling frequency of the DAC may be changed in a manner to minimize amplitude and phase transients on an EV-DO (Evolution Data Optimized) transmit signal. The sampling frequency of the DAC may also be changed so that none of the DAC images fall on either an EV-DO (Evolution Data Optimized) channel or a CDMA2000 paging channel. The wireless device may support Simultaneous Hybrid Dual Receiver (SHDR).

A wireless device configured for interference reduction is also described. The wireless device includes a transmitter, a primary receiver, a secondary receiver and a controller. The controller is configured to determine that a page is going to be received via a secondary receiver. The controller is also configured to determine that a digital-to-analog converter (DAC) image from a transmitter will cause interference with the secondary receiver when the page is received. The controller is further configured to change a sampling frequency of the DAC for the transmitter so that there are not any DAC images from the transmitter that will cause interference with the secondary receiver.

An apparatus configured for interference reduction is described. The apparatus includes means for determining that a page is going to be received via a secondary receiver. The apparatus also includes means for determining that a digital-to-analog converter (DAC) image from a transmitter will cause interference with the secondary receiver when the page is received. The apparatus further includes means for changing a sampling frequency of the DAC for the transmitter so that there are not any DAC images from the transmitter that will cause interference with the secondary receiver.

A computer-program product that includes a computer-readable medium having instructions thereon is described. The instructions include code for determining that a page is going to be received via a secondary receiver. The instructions also include code determining that a digital-to-analog converter (DAC) image from a transmitter will cause interference with the secondary receiver when the page is received. The instructions further include code for changing a sampling frequency of the DAC for the transmitter so that there are not any DAC images from the transmitter that will cause interference with the secondary receiver.

DETAILED DESCRIPTION

Figure 1:
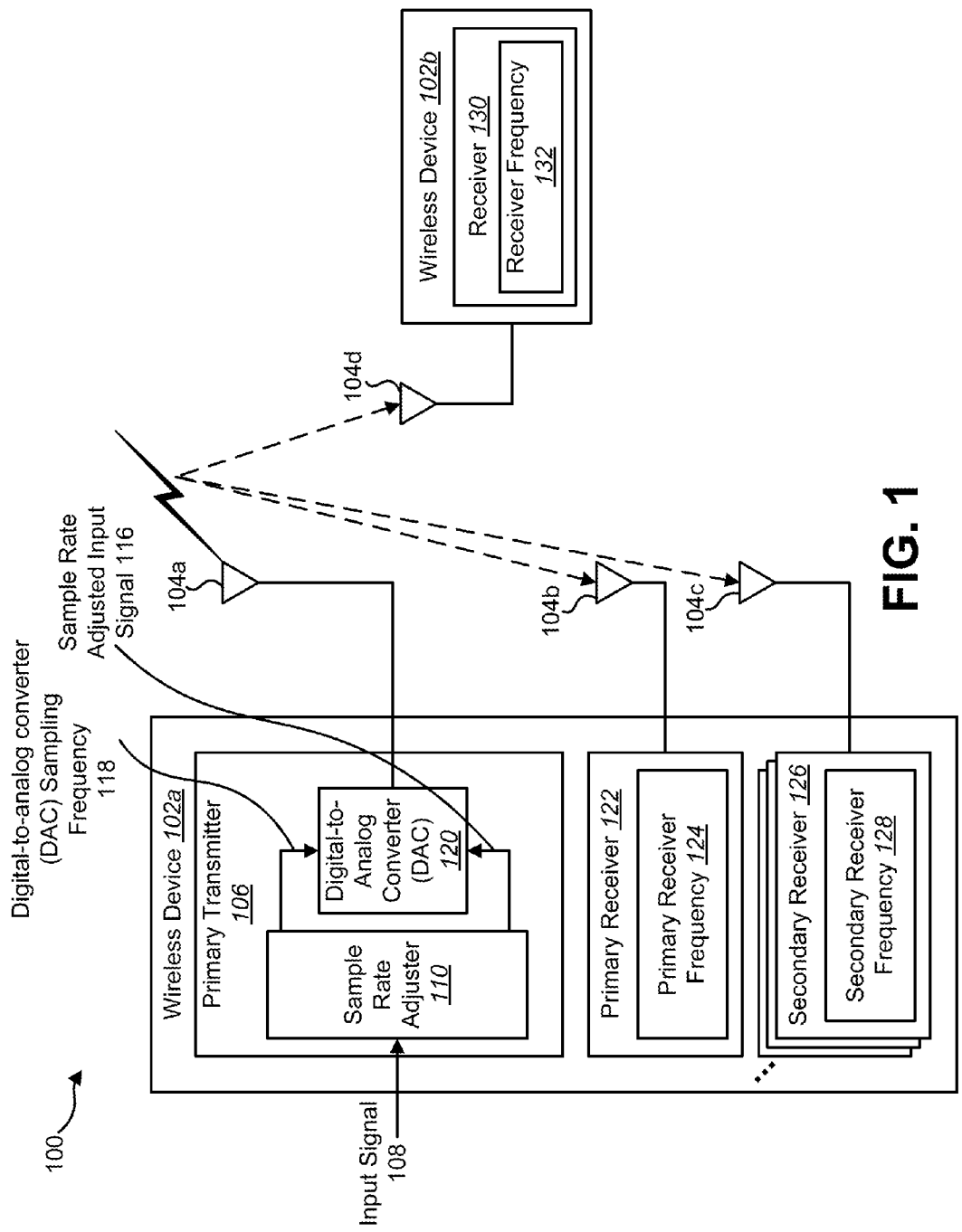
FIG. 1 shows a wireless communication system with multiple wireless devices.

FIG. 1 shows a wireless communication system 100 with multiple wireless devices 102. A wireless device 102 may be a base station, a wireless communication device, a controller or the like. A base station is a station that communicates with one or more wireless communication devices. A base station may also be referred to as, and may include some or all of the functionality of, an access point, a broadcast transmitter, a Node B, an evolved Node B, etc. The term "Base Station" will be used herein. Each base station provides communication coverage for a particular geographic area. A base station may provide communication coverage for one or more wireless communication devices. The term "cell" can refer to a base station and/or its coverage area, depending on the context in which the term is used.

A wireless communication device may also be referred to as, and may include some or all of the functionality of, a terminal, an access terminal, a user equipment (UE), a subscriber unit, a station, etc. A wireless communication device may be a cellular phone, a personal digital assistant (PDA), a wireless device, a wireless modem, a handheld device, a laptop computer, etc. A wireless communication device may communicate with zero, one or multiple base stations on the downlink and/or uplink at any given moment. The downlink (or forward link) refers to the communication link from a base station to a wireless communication device, and the uplink (or reverse link) refers to the communication link from a wireless communication device to a base station.

Wireless communication systems 100 may be multiple-access systems capable of supporting communication with multiple users by sharing the available system resources (e.g., bandwidth and transmit power). Examples of such multiple-access systems include code division multiple access (CDMA) systems, time division multiple access (TDMA) systems, frequency division multiple access (FDMA) systems, orthogonal frequency division multiple access (OFDMA) systems and spatial division multiple access (SDMA) systems.

A "multi-mode" wireless device 102 may use multiple wireless technologies simultaneously. Examples of such technologies include Bluetooth, cellular, wireless local area network (WLAN) and the Global Positioning System (GPS). In one configuration, the wireless device 102 may send cellular communications using a first antenna 104a, receive cellular communications using a second antenna 104b and receive other communications (e.g., Bluetooth, WLAN, GPS) using a third antenna 104c. A wireless device 102 may include Simultaneous Hybrid Dual Receiver (SHDR) functionality in which transmission and reception in a CDMA2000 1xEV-DO (Evolution Data Optimized) system are performed using a primary antenna while reception in a CDMA2000 1x system is performed using a secondary antenna in order to improve the through of communication for the primary antenna.

The wireless technologies may operate in different band classes. A band class is an allocation of a portion of the frequency spectrum for wireless communications. Examples of band classes include Cellular, Personal Communications Service (PCS) and International Mobile Telecommunications (IMT). Different frequencies may be utilized for different band classes. Different duplex offset may also be utilized for different band classes. The term "duplex offset" may refer to the difference in frequency between a wireless communications transmitter and a receiver. For example, the mobile transmit frequency is 824-849 megahertz (MHz) for the Cellular band class, 1850-1910 MHz for the PCS band class, 1920-1980 MHz for the IMT band class, etc. The duplex offset is 45 MHz (i.e., the receiver operates 45 MHz above the transmitter) for the cellular band class, 80 MHz for the PCS band class, 190 MHz for the IMT band class, etc.

A first wireless device 102a may use a primary transmitter 106 to transmit communications. In one configuration, the primary transmitter 106 may be a cellular transmitter. Transmitters are discussed in further detail below in relation to FIG. 3. The primary transmitter 106 may prepare an input signal 108 for transmission via the first antenna 104a. For example, the primary transmitter 106 may convert the input signal 108 from a digital signal to an analog signal using a digital-to-analog converter (DAC) 120 prior to transmission.

The digital-to-analog converter (DAC) 120 may operate using a clock signal with a digital-to-analog converter (DAC) sampling frequency 118. The digital-to-analog converter (DAC) 120 may produce an output signal having undesirable frequency "images." These images may result from the digital-to-analog converter (DAC) 120 output holding a particular value for one period of the clock cycle, so that the digital-to-analog converter (DAC) 120 output exactly matches the desired signal only once during each clock cycle. This is sometimes referred to as a zero-order hold. During the rest of the clock cycle, the digital-to-analog converter (DAC) 120 output and ideal signal may differ, creating error energy. Digital-to-analog converter (DAC) 120 images may be produced at harmonics of the digital-to-analog converter (DAC) sampling frequency 118. For example, if the digital-to-analog converter (DAC) sampling frequency 118 is 100 megahertz (MHz), an undesirable image may be produced at 100 MHz, 200 MHz, 300 MHz, and so on.

The images produced by the digital-to-analog converter (DAC) 120 output signal may have implications for wireless devices 102, particularly "multi-mode" devices that are configured to support multiple wireless technologies. For example, the wireless device 102a may include a primary receiver 122. The primary receiver 122 may receive communications using the second antenna 104b. The received communications may be received at a primary receiver frequency 124. If the images produced in the digital-to-analog converter (DAC) 120 output signal fall on or near the primary receiver frequency 124, interference with the primary receiver 122 may occur. Likewise, if the images produced in the digital-to-analog converter (DAC) 120 output signal fall on or near a secondary receiver frequency 128 used by a secondary receiver 126 on the wireless device 102a, interference with the secondary receiver 126 may occur. A secondary receiver 126 on the wireless device 102a may receive wireless communications via a third antenna 104c. The secondary receiver 126 may receive Bluetooth signals, wireless local area network (WLAN) signals, Global Positioning System (GPS) signals, etc. A wireless device 102 may have multiple secondary receivers 126, with each secondary receiver 126 having an antenna 104c.

The primary receiver frequency 124 may depend on the band class in which the primary transmitter 106 is currently operating. Thus, the digital-to-analog converter (DAC) sampling frequency 118 of the digital-to-analog converter (DAC) 120 may be adjusted based on the band class in which the primary transmitter 106 is currently operating. The primary receiver frequency 124 may also depend on which wireless technology is presently being used.

A second wireless device 102b may receive the transmitted signals from the first wireless device 102a using an antenna 104d. Interference may occur when the images produced in the digital-to-analog converter (DAC) 120 output signal fall on or near a receiver frequency 132 used by a receiver 130 on the second wireless device 102b.

Because a multi-mode wireless device 102 should be capable of operating in different band classes, it may be desirable that the digital-to-analog converter (DAC) sampling frequency 118 be selected so that DAC images do not cause interference with the primary receiver 122, secondary receivers 126 or the receiver 130 on the second wireless device 102b. Specifically, the digital-to-analog converter (DAC) sampling frequency 118 may be chosen so that the multi-mode modem is able to work with all the possible band classes and duplex offsets that the multi-mode modem is supposed to be able to support. However, it may be extremely difficult to select a single digital-to-analog converter (DAC) sampling frequency 118 that will accomplish this objective. Instead, it may be beneficial for the digital-to-analog converter (DAC) sampling frequency 118 to be adjustable to avoid interference. The digital-to-analog converter (DAC) sampling frequency 118 may be adjusted so that images in the digital-to-analog converter (DAC) 120 output signal are outside of any frequency bands within which receivers of interest may be operating.

In order to adjust the digital-to-analog converter (DAC) sampling frequency 118, the sample rate of the signal input to the digital-to-analog converter (DAC) 120 should also be changed. The primary receiver 106 may include a sample rate adjuster 110. The sample rate adjuster 110 is discussed in additional detail below in relation to FIG. 3. The sample rate adjuster 110 may receive an input signal 108. The sample rate adjuster 110 may then adjust the sample rate for the input signal 108 and output a sample rate adjusted input signal 116 to a digital-to-analog converter (DAC) 120. The sample rate adjuster 110 may also determine a digital-to-analog converter (DAC) sampling frequency 118. The digital-to-analog converter (DAC) sampling frequency 118 may be output to the digital-to-analog converter (DAC) 120 by the sample rate adjuster 110. By adjusting both the sample rate of the input signal 108 and the digital-to-analog converter (DAC) sampling frequency 118, images in the digital-to-analog converter (DAC) 120 output may be moved in frequency to avoid interference.

Figure 2:
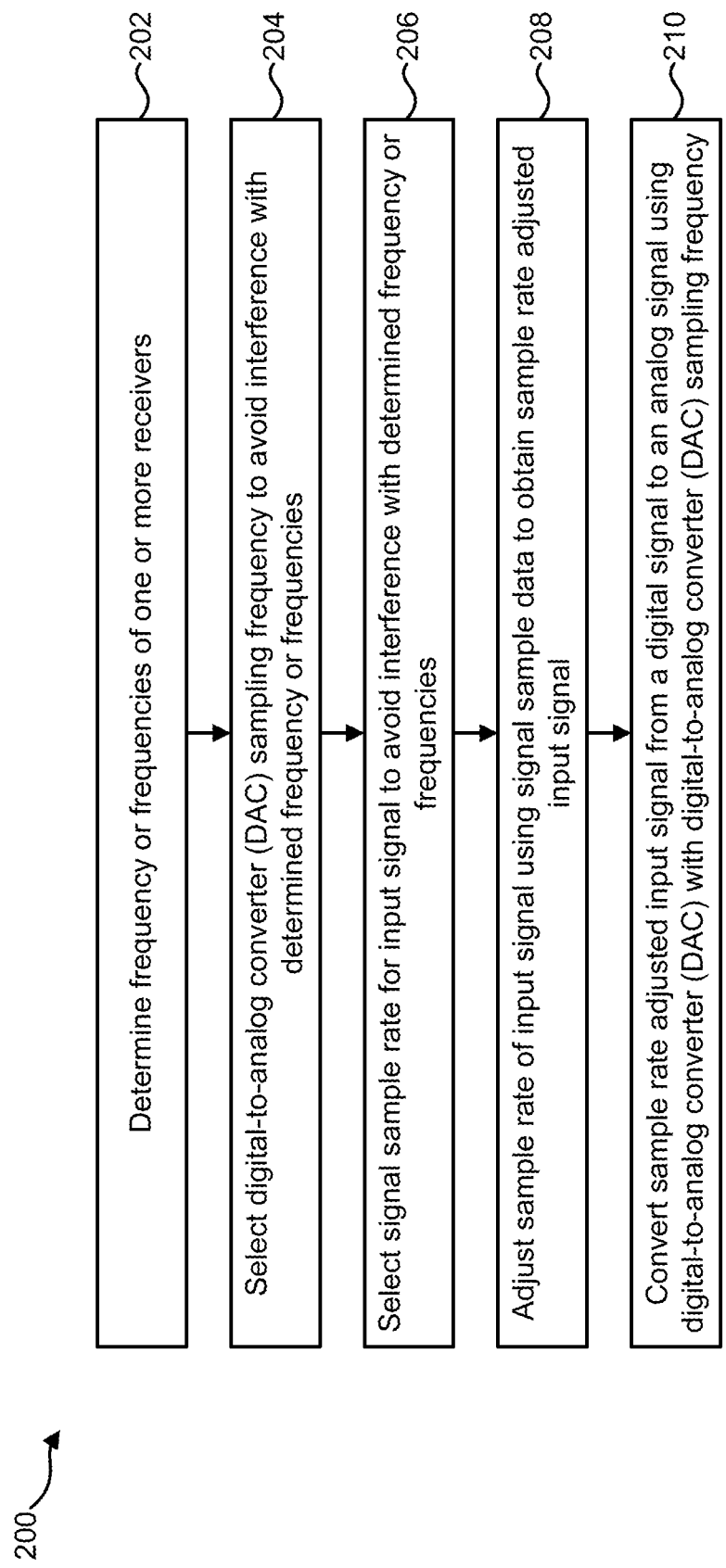
FIG. 2 is a flow diagram of a method for adjusting sample rates in a digital-to-analog converter (DAC) to reduce interference.

FIG. 2 is a flow diagram of a method 200 for adjusting sample rates in a digital-to-analog converter (DAC) 120 to reduce interference. The method 200 may be performed by a wireless device 102a. The wireless device 102a may determine 202 a frequency or frequencies of one or more receivers. The one or more receivers may be receivers that can potentially receive interference from the wireless device 102a. The receivers may include a primary receiver 122 (such as a cellular receiver) on the wireless device 102a, a secondary receiver 126 (such as a Bluetooth receiver, a WLAN receiver or a GPS receiver) on the wireless device 102a and one or more receivers 130 on one or more other wireless devices 102b.

The wireless device 102a may select 204 a digital-to-analog converter (DAC) sampling frequency 118 to avoid interference with the determined frequency or frequencies. In one configuration, the digital-to-analog converter (DAC) sampling frequency 118 may depend on which wireless technology or technologies are being used by the wireless device 102a. The digital-to-analog converter (DAC) sampling frequency 118 may also depend on the wireless technologies being used by other nearby wireless devices 102b.

The wireless device 102a may also select 206 a signal sample rate for the input signal 108 to avoid interference with the determined frequency or frequencies. In order to adjust the sample rate of a digital-to-analog converter (DAC) 120, both the digital-to-analog converter (DAC) sampling frequency 118 and the sample rate of the signal input into the digital-to-analog converter (DAC) 120 need to be changed. The wireless device 102a may then adjust 208 the sample rate of the input signal 108 using the selected signal sample rate to obtain a sample rate adjusted input signal 116. The wireless device 102b may convert 210 the sample rate adjusted input signal 116 from a digital signal to an analog signal using a digital-to-analog converter (DAC) 120 with a digital-to-analog converter (DAC) sampling frequency 118.

Figure 3:
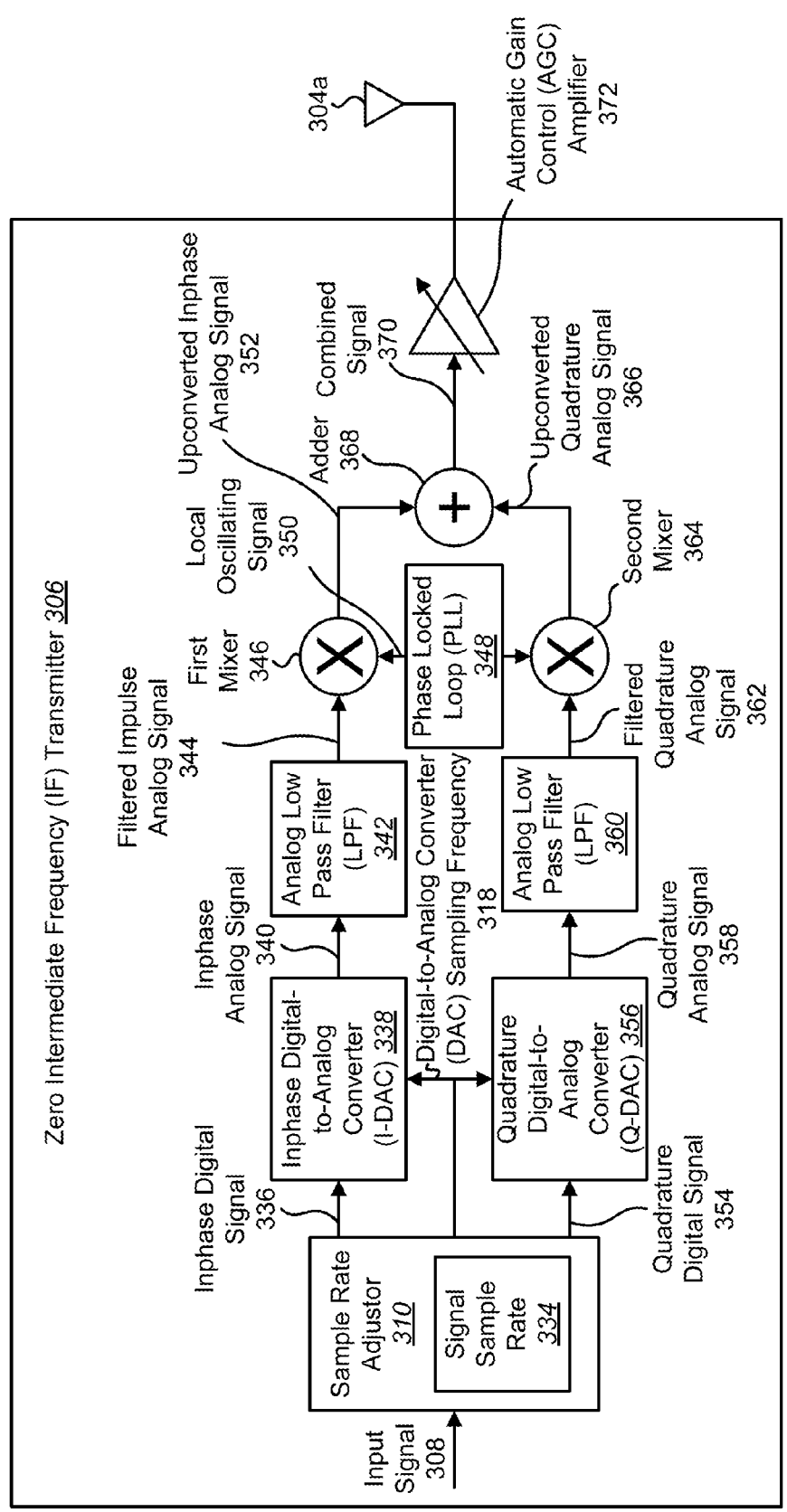
FIG. 3 is a block diagram illustrating a zero intermediate frequency (IF) transmitter for use in the present systems and methods.

FIG. 3 is a block diagram illustrating a zero intermediate frequency (IF) transmitter 306 for use in the present systems and methods. The zero intermediate frequency (IF) transmitter 306 of FIG. 3 may be one configuration of the primary transmitter 106 of FIG. 1. Although a zero intermediate frequency (IF) transmitter 306 is used for purposes of illustration, the techniques herein are not limited to zero intermediate frequency (IF) transmitters 306. For example, a super heterodyne transmitter or a low intermediate frequency transmitter may also be used. In a zero intermediate frequency (IF) transmitter 306, a signal may be directly upconverted from a baseband signal to a radio frequency (RF) signal without any intermediate frequency stages.

The zero intermediate frequency (IF) transmitter 306 may include a sample rate adjuster 310. The sample rate adjuster 310 of FIG. 3 may be one configuration of the sample rate adjuster 110 of FIG. 1. Sample rate adjusters 310 are discussed in further detail below in relation to FIG. 4 and FIG. 5. The sample rate adjuster 310 may receive an input signal 308. The input signal 308 may be a baseband signal. The sample rate adjuster 310 may include a signal sample rate 334. The signal sample rate 334 may correspond to a determined digital-to-analog converter (DAC) sampling frequency 318. In one configuration, the signal sample rate 334 and the digital-to-analog converter (DAC) sampling frequency 318 may be the same.

The sample rate adjuster 310 may output an inphase digital signal 336 and a quadrature digital signal 354. The zero intermediate frequency (IF) transmitter 306 may include an inphase digital-to-analog converter (I-DAC) 338 and a quadrature digital-to-analog converter (Q-DAC) 356. The inphase digital-to-analog converter (I-DAC) 338 may receive the inphase digital signal 336 and the digital-to-analog converter (DAC) sampling frequency 318 from the sample rate adjuster 310. The inphase digital-to-analog converter (I-DAC) 338 may then convert the inphase digital signal 336 to an inphase analog signal 340 using the digital-to-analog converter (DAC) sampling frequency 318. The inphase analog signal 340 may be filtered using an analog low pass filter (LPF) 342. The quadrature digital-to-analog converter (Q-DAC) 356 may receive the quadrature digital signal 354 and the digital-to-analog converter (DAC) sampling frequency 318 from the sample rate adjuster 310. The quadrature digital-to-analog converter (Q-DAC) 356 may then convert the quadrature digital signal 354 to a quadrature analog signal 358 using the digital-to-analog converter (DAC) sampling frequency 318. The quadrature analog signal 358 may be filtered using an analog low pass filter (LPF) 360.

Without adjusting the digital-to-analog converter (DAC) sampling frequency 318 of the quadrature digital-to-analog converter (Q-DAC) 356 and the inphase digital-to-analog converter (I-DAC) 338, both the filtered quadrature analog signal 362 and the filtered inphase analog signal 344 may include undesirable frequency images introduced by the quadrature digital-to-analog converter (Q-DAC) 356 and the inphase digital-to-analog converter (I-DAC) 338 referred to as digital-to-analog converter (DAC) images. The low pass filters (LPFs) 342, 360 typically do not attenuate the DAC images sufficiently to prevent the DAC images from interfering with receivers on the wireless device 102a and receivers on other wireless devices 102b. Instead of trying to filter out the DAC images, the DAC images may be moved in the frequency band so that they no long interfere with receivers on the wireless device 102a or receivers on other wireless devices 102b. Thus, the need for strong analog and/or RF filters to mitigate the interference caused by DAC images may be eliminated.

The filtered inphase analog signal 344 may be upconverted to a radio frequency (RF) using a first mixer 346 and a local oscillating signal 350 generated by a phase locked loop (PLL) 348. The filtered quadrature analog signal 362 may be upconverted to a radio frequency (RF) using a second mixer 364 and the local oscillating signal 350 generated by the phase locked loop (PLL) 348. Without adjusting the digital-to-analog converter (DAC) sampling frequency 318 of the quadrature digital-to-analog converter (Q-DAC) 356 and the inphase digital-to-analog converter (I-DAC) 338, both the upconverted quadrature analog signal 352 and the upconverted quadrature analog signal 366 may include undesirable frequency images that have also been upconverted to radio frequency (RF). These upconverted DAC images may interfere with the primary receiver 122, secondary receivers 126 and receivers 130 located outside of the wireless device 102a, making it more difficult for these receivers to demodulate and receive their respective signals.

By adjusting the digital-to-analog converter (DAC) sampling frequency 318, the upconverted inphase analog signal 352 and the upconverted quadrature analog signal 366 may have adjusted DAC images, decreasing the likelihood of interference. The upconverted inphase analog signal 352 and the upconverted quadrature analog signal 366 may then be added using an adder 368 to obtain a combined signal 370. The combined signal 370 may be amplified using an Automatic Gain Control (AGC) amplifier 372 and then transmitted using an antenna 304a.

Figure 4:
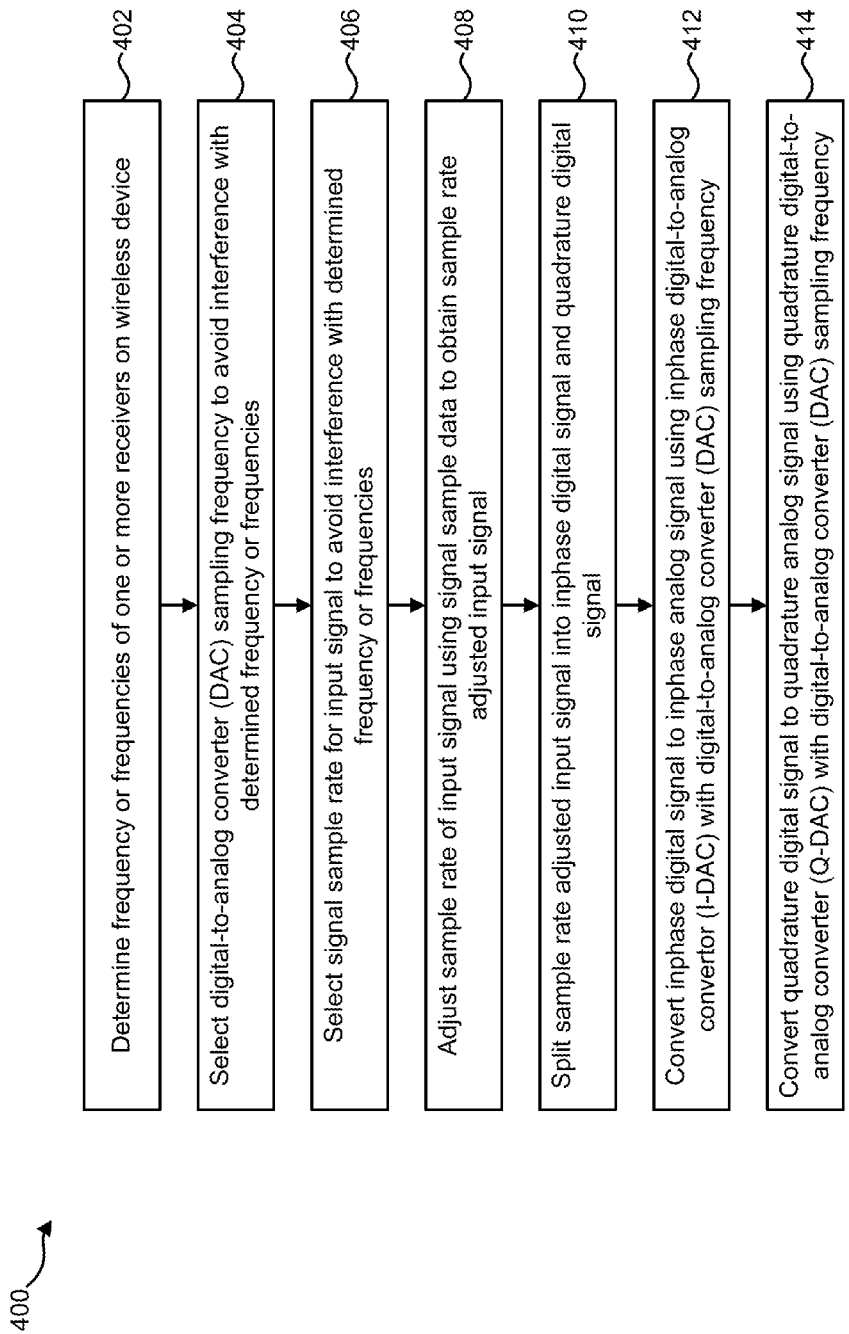
FIG. 4 is a flow diagram of a method for adjusting the digital-to-analog converter (DAC) sampling frequency to reduce interference.

FIG. 4 is a flow diagram of a method 400 for adjusting the digital-to-analog converter (DAC) sampling frequency 318 to reduce interference. The method 400 may be performed by a wireless device 102a. The method 400 may be implemented in software, firmware or hardware of the wireless device 102a (e.g., in a multi-mode modem that is included within a wireless device 102a).

The wireless device 102a may determine 402 the frequency or frequencies of one or more receivers on the wireless device 102a. The frequency of a receiver may refer to the frequency at which the receiver receives desired signals. The wireless device 102a may select 404 a digital-to-analog converter (DAC) sampling frequency 318 to avoid interference with the determined frequency or frequencies. For example, the wireless device 102a may select a digital-to-analog converter (DAC) sampling frequency 318 such that DAC images, when upconverted to radio frequency (RF), do not interfere with the determined frequency or frequencies. In one configuration, the digital-to-analog converter (DAC) sampling frequency 318 may be selected so that frequencies of upconverted DAC images differ from the determined frequency or frequencies by at least 2 MHz.

The wireless device 102a may select 406 a signal sample rate 334 for an input signal 308 to avoid interference with the determined frequency or frequencies. The signal sample rate 334 and the digital-to-analog converter (DAC) clock rate (i.e., the digital-to-analog converter (DAC) sampling frequency 118) are the same. The wireless device 102a may adjust 408 the sample rate 334 of the input signal 308 to the selected signal sample rate 344 to obtain a sample rate adjusted input signal 116. The sample rate adjusted input signal 116 may thus be the input signal 308 with an adjusted sample rate.

The wireless device 102a may split 410 the sample rate adjusted input signal 116 into an inphase digital signal 336 and a quadrature digital signal 354. The wireless device 102a may then convert 412 the inphase digital signal 336 to an inphase analog signal 340 using an inphase digital-to-analog converter (I-DAC) 338 with the digital-to-analog converter (DAC) sampling frequency 318. The wireless device 102a may also convert 414 the quadrature digital signal 354 to a quadrature analog signal 358 using a quadrature digital-to-analog converter (Q-DAC) 356.

Figure 5:
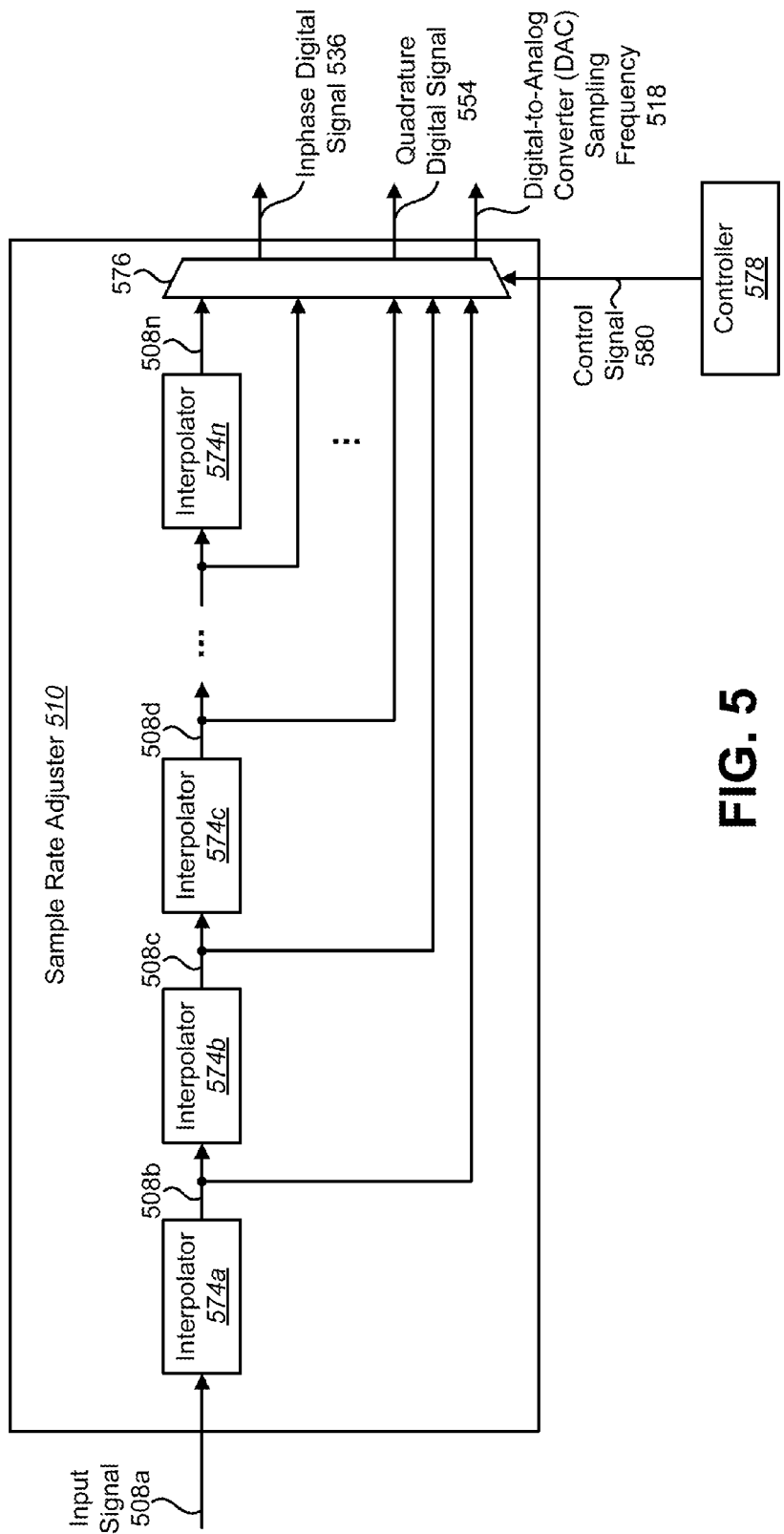
FIG. 5 is a block diagram illustrating a sample rate adjuster for use in the present systems and methods.

FIG. 5 is a block diagram illustrating a sample rate adjuster 510 for use in the present systems and methods. The sample rate adjuster 510 of FIG. 5 may be one configuration of the sample rate adjuster 110 of FIG. 1. The sample rate adjuster 510 may receive an input signal 508a. The input signal 508a may be provided to one or more interpolators 574a-n. Each successive interpolator 574 may double the sample rate for the input signal 508a. For example, in a CDMA system, the chip rate (cx) of the input signal 508a may be cx1, the chip rate of the output 508b of the first interpolator 574a may be cx2 (twice the chip rate of the input signal) and the chip rate of the output 508c of the second interpolator 574b may be cx4. A group of interpolators 574 may be referred to as an interpolator bank.

A CDMA2000 system may have a fundamental chip rate of 1.2288 MHz. The fundamental chip rate may be referred to as chipx1. Using interpolators 574, the chip rate may be increased to chipx2 (i.e., 1.2288 MHzx2), chipx4 (i.e., 1.2288 MHzx4), chipx8, chipx16, chipx32, chipx64, etc.

In one configuration, the output 508b-n of an interpolator 574 may be any integer multiple of the sample rate of the input signal 508a. An interpolator 574 may be configured to insert a certain number of zeroes between adjacent samples. An interpolator 574 may also include an anti-aliasing filter.

The output of each interpolator 574 may be provided as an input to a multiplexer 576. A control signal 580 may be provided as an input to the multiplexer 576, allowing selection of which output is passed as the inphase digital signal 536 and the quadrature digital signal 554. The inphase digital signal 536 and the quadrature digital signal 554 together represent the complex modulation of the transmit signal. Since the transmit signal has both amplitude and phase modulation, it is by definition complex and requires both an inphase component and a quadrature component.

The control signal 580 may be generated by a controller 578 that determines what the sample rates of the inphase digital signal 536 and the quadrature digital signal 554 should be to avoid interference. The controller 578 may also select the digital-to-analog converter (DAC) sampling frequency 518 of the inphase digital-to-analog converter (I-DAC) 338 and the quadrature digital-to-analog converter (Q-DAC) 356 to avoid interference. Typically, the digital-to-analog converter (DAC) sampling frequency 518 comes from a phase locked loop (PLL) and digital dividers.

Figure 6:
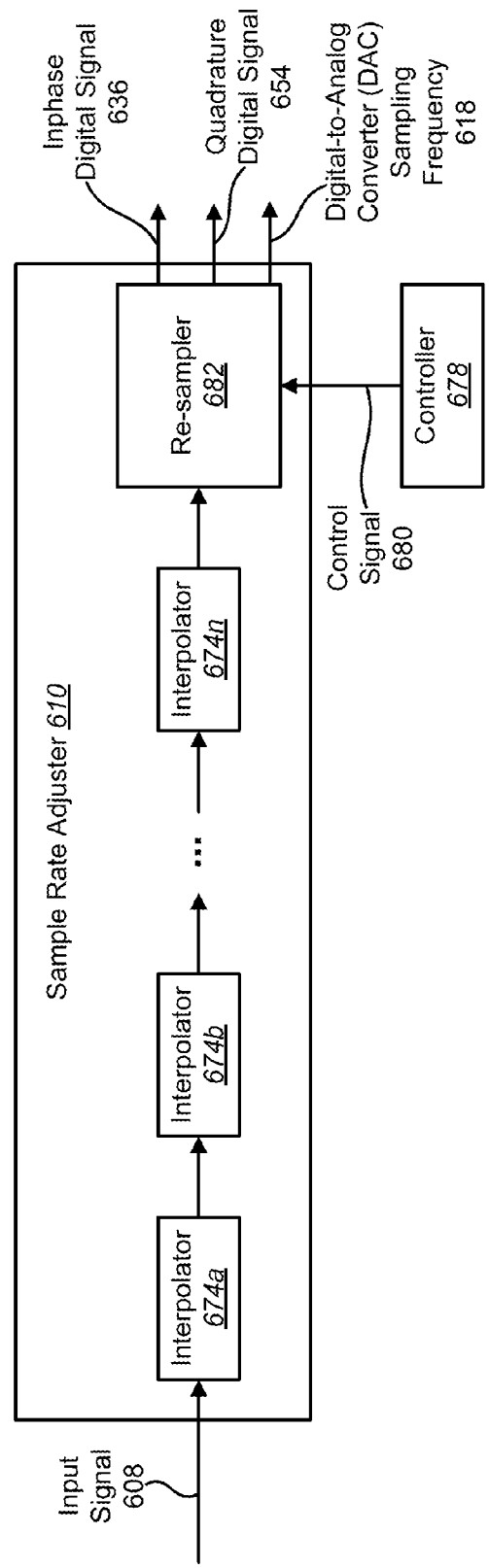
FIG. 6 is a block diagram illustrating another sample rate adjuster for use in the present systems and methods.

FIG. 6 is a block diagram illustrating another sample rate adjuster 610 for use in the present systems and methods. The sample rate adjuster 610 of FIG. 6 may be one configuration of the sample rate adjuster 110 of FIG. 1. The sample rate adjuster 610 may receive an input signal 608. The input signal 608 may then be provided to a first interpolator 674a. The output of the first interpolator 674a may be input into a second interpolator 674b. The input signal 608 may be provided to additional interpolators 674. The output of a final interpolator 674n may then be provided to a re-sampler 682. The re-sampler 682 may be a special kind of interpolator. Unlike an interpolator 674, the sample rate of the output of the re-sampler 682 does not have to be an integer multiple of the sample rate of the input signal 608.

For example, the re-sampler 682 may be configured to accept an input at a particular lower limit sample rate (e.g., c×64) and provide an output at any rate between the lower limit sample rate and a particular upper limit sample rate (e.g., c×128). Thus, the use of a re-sampler 682 makes it possible for the DAC images to be placed in any desired frequency location within a given range (which depends on the lower limit sample rate and the upper limit sample rate). A controller 678 may instruct the re-sampler 682 concerning the specific sample rate that the input signal 608 should be sampled at using a control signal 680. Multiple interpolators 674a-n may be used to change the sample rate of the input signal 608 to the desired lower limit sampling rate prior to passing the input signal 608 through the re-sampler 682.

The re-sampler 682 may output an inphase digital signal 636 and a quadrature digital signal 654. Both the inphase digital signal 636 and the quadrature digital signal 654 may have the desired sampling rate. The re-sampler 682 may also output a digital-to-analog converter (DAC) sampling frequency 618. The digital-to-analog converter (DAC) sampling frequency 618 may be the same as the sample rate of the inphase digital signal 636 and the quadrature digital signal 654.

In one configuration, the sample rate adjuster 110 of FIG. 1 may include a combination of the sample rate adjuster 510 of FIG. 5 and the sample rate adjuster 610 of FIG. 6.

Figure 7:
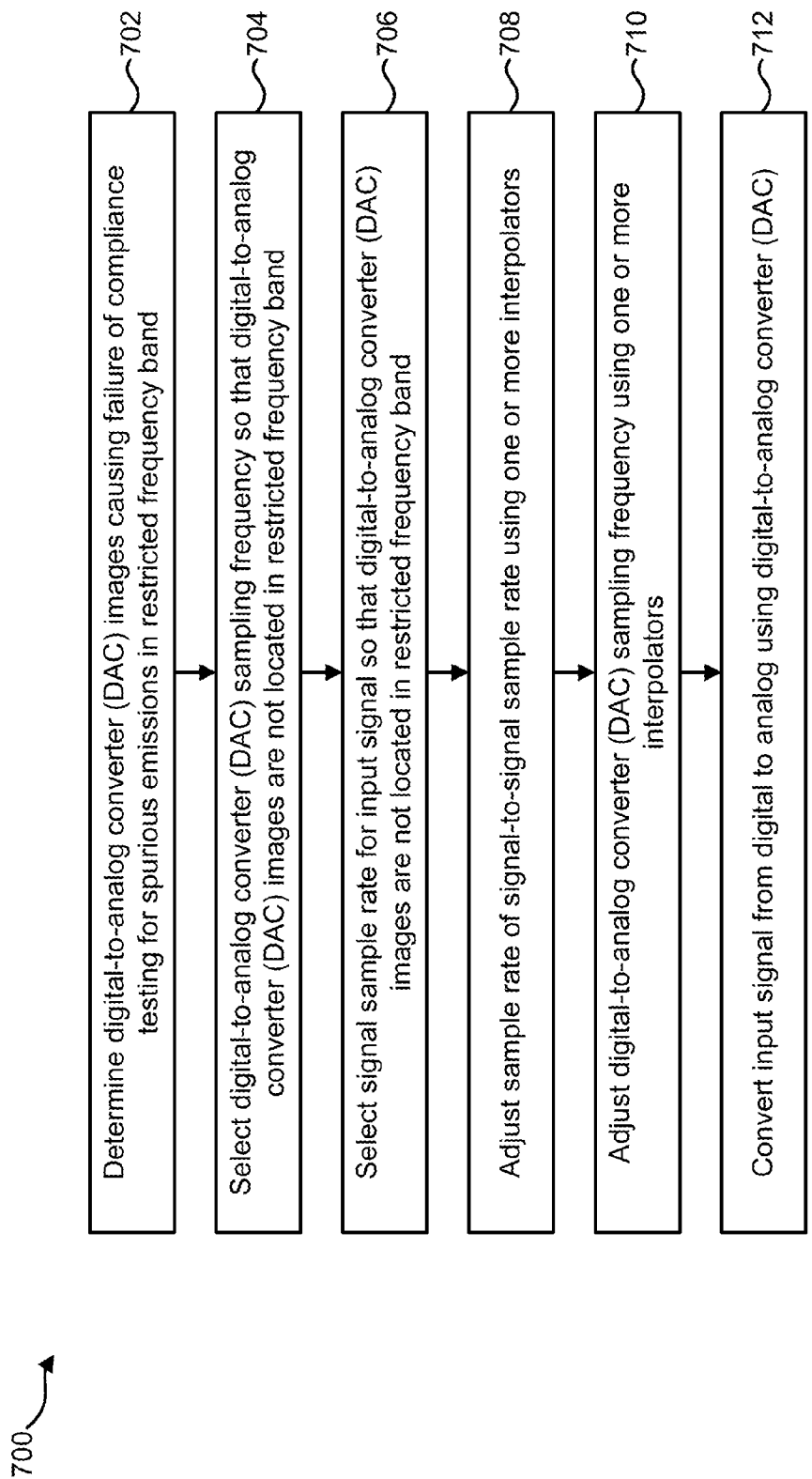
FIG. 7 is a flow diagram of a method for adjusting the digital-to-analog converter (DAC) sampling frequency using interpolators.

FIG. 7 is a flow diagram of a method 700 for adjusting the digital-to-analog converter (DAC) sampling frequency 318 using interpolators 574, 674. The method 700 may be performed by a wireless device 102a. The wireless device 102a may determine 702 digital-to-analog converter (DAC) images causing a failure of compliance testing for spurious emissions. The term "spurious emissions" may refer to any radio frequency not deliberately created or transmitted. Spurious emissions are often generated by a device that does not create other frequencies. A harmonic or other signal outside a transmitter's assigned channel is typically considered a spurious emission. The DAC images falling within a restricted frequency band may be spurious emissions. Depending on the strength of the digital-to-analog converter (DAC) emissions, the wireless device 102a may fail compliance testing requirements.

There are various spurious emissions requirements that a wireless device 102a may have to comply with. For example, a government agency may specify that for transmissions in a particular frequency band, any output in an adjacent frequency band (such as a restricted frequency band) has to fall below a certain threshold.

The wireless device 102a may select 704 a digital-to-analog converter (DAC) sampling frequency 318 so that the DAC images are not located in a restricted frequency band. The wireless device 102a may also select 706 a signal sample rate 334 for an input signal 308 so that the DAC images are not located in a restricted frequency band. In one configuration, the signal sample rate 334 and the digital-to-analog converter (DAC) sampling frequency 318 may be the same.

The wireless device may adjust 708 the sample rate of the input signal 308 to the signal sample rate 334 using one or more interpolators 574, 674. The wireless device 102a may adjust the sample rate of the input signal 308 using a multiplexer 576 as illustrated in FIG. 5 or a re-sampler 682 as illustrated in FIG. 6. The wireless device 102a may also adjust 710 the digital-to-analog converter (DAC) sampling frequency 318 using one or more interpolators 574, 674. The wireless device 102a may then convert 712 the input signal 308 from a digital signal to an analog signal using the digital-to-analog converter (DAC) 120.

Figure 8:
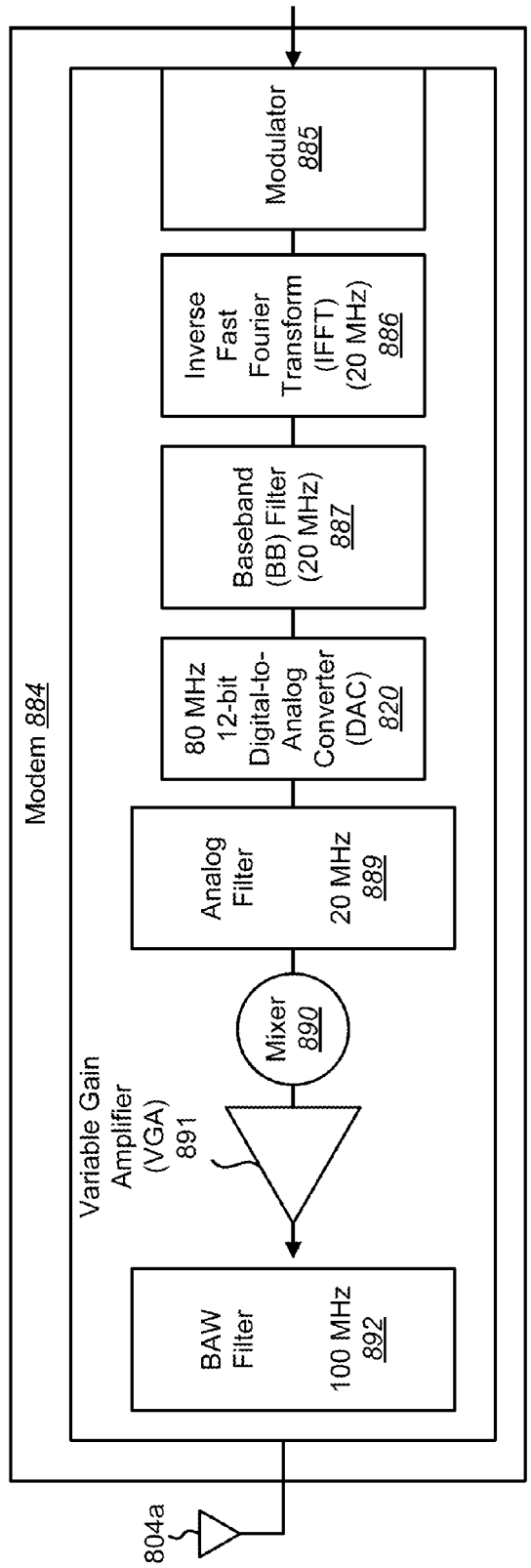
FIG. 8 is a block diagram illustrating a configuration of the front-end architecture for a modem.

FIG. 8 is a block diagram illustrating a configuration of the front-end architecture for a modem 884. The modem 884 may be part of a wireless device 102a. A transmission signal stream may be sent through a modulator 885 to prepare the signal stream for conveying a message. An inverse fast Fourier transform (IFFT) 886 may convert the signal stream from the frequency domain to the time domain. A baseband (BB) filter 887 may filter out the undesired high-frequency images. A digital-to-analog converter (DAC) 820 may convert the digital signal stream to an analog signal stream and an analog filter 889 may provide additional filtering to the signal stream to further reduce the higher frequency images.

A mixer 890 may convert the analog baseband signal to RF frequencies. A variable gain amplifier (VGA) 891 may maintain a desired output signal level by controlling the gain of the signal stream. Finally, the signal stream may be passed through a Bulk Acoustic Wave (BAW) filter 892 before being transmitted by an antenna 804a. The Bulk Acoustic Wave (BAW) filter 892 is an RF passband filter at the center frequency of the transmit channel with a stopband that further suppresses the high frequency images, so that the images are well below the noise floor of the receiver for the receive channel.

Figure 9:
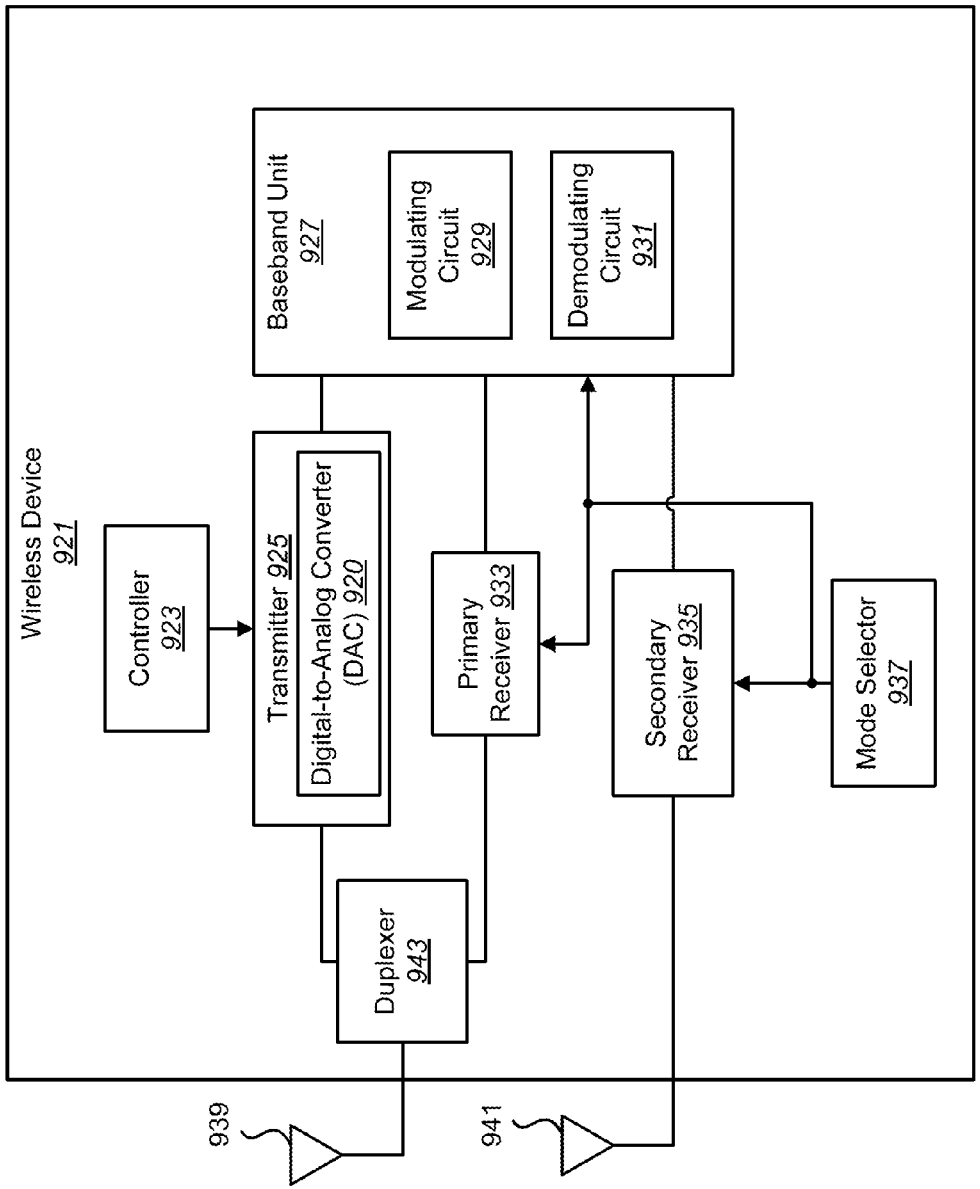
FIG. 9 is a block diagram of a wireless communication device that includes Simultaneous Hybrid Dual Receiver (SHDR) functionality.

FIG. 9 is a block diagram of a wireless communication device 921 that includes Simultaneous Hybrid Dual Receiver (SHDR) functionality. The wireless communication device 921 of FIG. 9 may be one configuration of the first wireless device 102a of FIG. 1. In CDMA2000 plus Evolution-Data Optimized (EV-DO) systems, when a wireless communication device 921 is in an EV-DO data session call, a diversity receiver (i.e., a secondary receiver 935) may be used to check for CDMA2000 voice call pages. This is referred to as the Simultaneous Hybrid Dual Receiver (SHDR) mode of operation.

The wireless communication device 921 may include a baseband unit 927. The baseband unit 927 may include a modulating circuit 929 and a demodulating circuit 931. The modulating circuit 929 may include an EV-DO modulator. The demodulating circuit 931 may include a CDMA2000 demodulator and an EV-DO demodulator. The baseband unit 927 may be connected a transmitter 925, a primary receiver 933 and a secondary receiver 935. The transmitter 925 of FIG. 9 may be one configuration of the primary transmitter 106 of FIG. 1. The transmitter 925 may be controlled by a controller 923. The transmitter 925 and the primary receiver 933 may be connected to a primary antenna 939 through a duplexer 943. In one configuration, the transmitter 925 and the primary receiver 933 may be capable of transmitting and receiving signals in the 800 MHz band and the 2 gigahertz (GHz) band.

The secondary receiver 935 may be connected to a secondary antenna 941. In one configuration, the secondary receiver 935 may be capable of receiving signals in the 800 MHz band, 2 GHz band and 1.5 GHz band independently from the primary receiver 933. When the transmitter 925 and the primary receiver 933 are in use for an EV-DO data session call, the secondary receiver 935 may be used to check for CDMA2000 voice call pages. A mode selector 937 may control the use of the primary receiver 933 and the secondary receiver 935.

The Simultaneous Hybrid Dual Receiver (SHDR) mode of operation may pose challenges for the transmitter 925 to meet the required receive band noise specifications. One problem is having a digital-to-analog converter (DAC) image from the EV-DO transmitter 925 fall on the CDMA2000 receiver paging channel. The CDMA2000 paging channel may be any channel of any band class that the wireless communication device 921 supports. Therefore, it is not possible to intelligently select a digital-to-analog converter (DAC) sampling frequency for the EV-DO transmitter 925 at the start of the EV-DO data session that will work for all supported channels.

However, just before a CDMA2000 page is received, the CDMA2000 receiver (i.e., the secondary receiver 935) knows what frequency is going to be used to receive the CDMA2000 page. The knowledge of the frequency used to receive the CDMA2000 page may be used to dynamically change the EV-DO transmitter 925 digital-to-analog converter (DAC) sampling frequency while in the middle of the data session call. The EV-DO transmitter 925 digital-to-analog converter (DAC) sampling frequency may be changed so that none of the digital-to-analog converter (DAC) images fall on either the EV-DO receive channel or the CDMA2000 paging channel.

Figure 10:
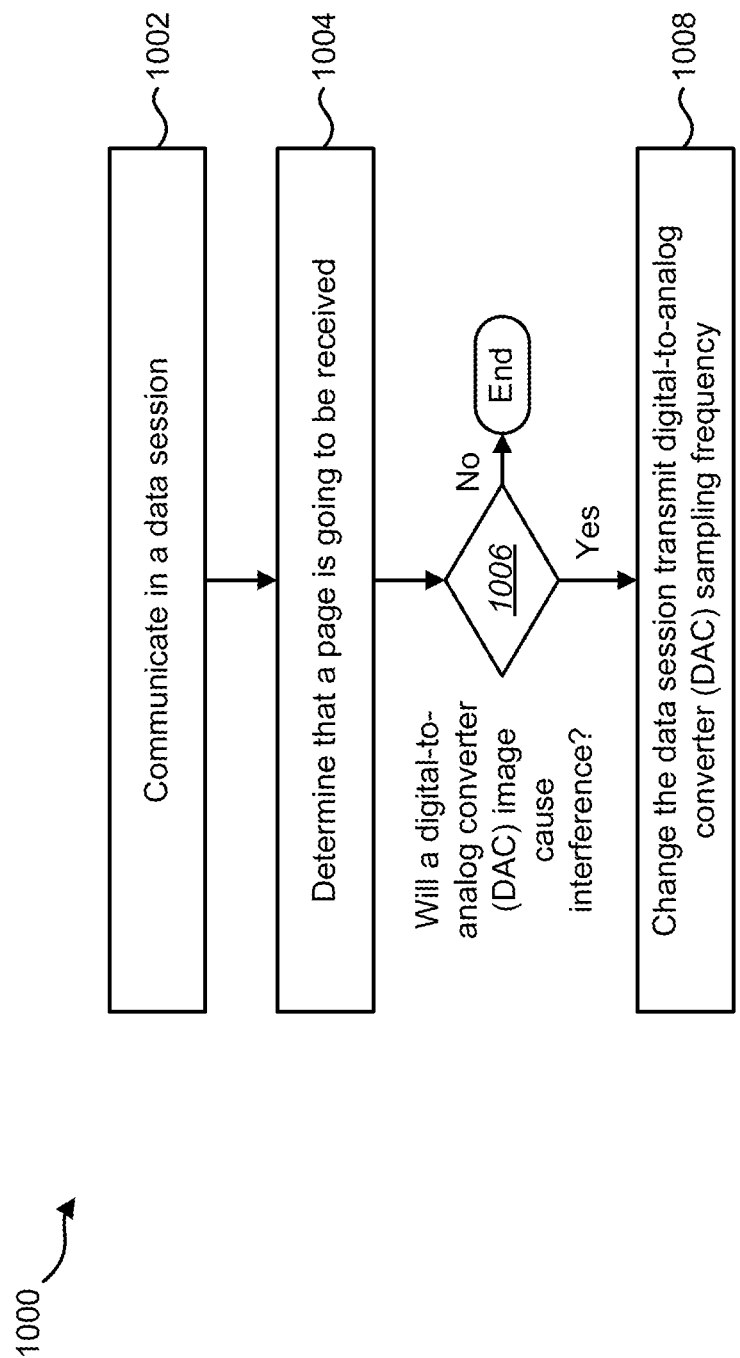
FIG. 10 is a flow diagram of a method for dynamically changing the digital-to-analog converter (DAC) sampling frequency.

FIG. 10 is a flow diagram of a method 1000 for dynamically changing the digital-to-analog converter (DAC) 920 sampling frequency. The method 1000 may be performed by a wireless communication device 921. In one configuration, the method 1000 may be performed by a controller 923 on the wireless communication device 921. The wireless communication device 921 may communicate 1002 in a data session. For example, the wireless communication 921 device may send and receive data in an EV-DO data session call.

The wireless communication device 921 may determine 1004 that a page is going to be received. In one configuration, the page may be a CDMA2000 page. When it is determined that a page is going to be received, the wireless communication device 921 may determine 1006 whether a digital-to-analog converter (DAC) image from the EV-DO transmitter 925 will cause interference with the CDMA2000 receiver (i.e., the secondary receiver 935). In other words, it may be determined whether there is a digital-to-analog converter (DAC) image either at or very close to the frequency at which the CDMA2000 page is going to be received. If not, then the method ends without changing the EV-DO transmit digital-to-analog converter (DAC) 920 sampling frequency.

If the current data session transmit digital-to-analog converter (DAC) 920 sampling frequency creates a digital-to-analog converter (DAC) image that falls on the channel that the diversity receiver is going to use to attempt to check for pages, then the wireless communication device 921 may change 1008 the data session transmit digital-to-analog converter (DAC) 920 sampling frequency. In one configuration, the current EV-DO transmit digital-to-analog converter (DAC) 920 sampling frequency may create a digital-to-analog converter (DAC) image that falls on the CDMA2000 channel that the diversity receiver is going to use to check for CDMA2000 pages. The wireless communication device 921 may change the EV-DO transmit digital-to-analog converter (DAC) 920 sampling frequency. The digital-to-analog converter (DAC) 920 sampling frequency may be changed 1008 in a manner to minimize amplitude and phase transients on the data session transmit signal. In other words, digital-to-analog converter (DAC) sampling frequency may be changed so that none of the digital-to-analog converter (DAC) images fall on either the EV-DO receive channel or the CDMA2000 paging channel The method 1000 may be repeated each time that a CDMA2000 page is received. Thus, the EV-DO transmit digital-to-analog converter (DAC) 920 sampling frequency may be changed multiple times during an EV-DO data call. The method 1000 may be implemented in software, firmware and/or hardware of a wireless communication device 921 that supports the Simultaneous Hybrid Dual Receiver (SHDR) mode of operation.

The sampling frequency change mechanism may include provisions for time aligning the sampling frequency change with a boundary of the waveform being transmitted. Example waveform boundaries include the frame, the slot, the power control group or the block processing group boundary. Time alignment may be performed because sample rates may be changed dynamically while in the middle of transmitting. The sampling frequency change may cause a small glitch in the waveform; time aligning with one of the aforementioned boundaries can mitigate the impact to the demodulation of the waveform at the base station receiver.

Figure 11:
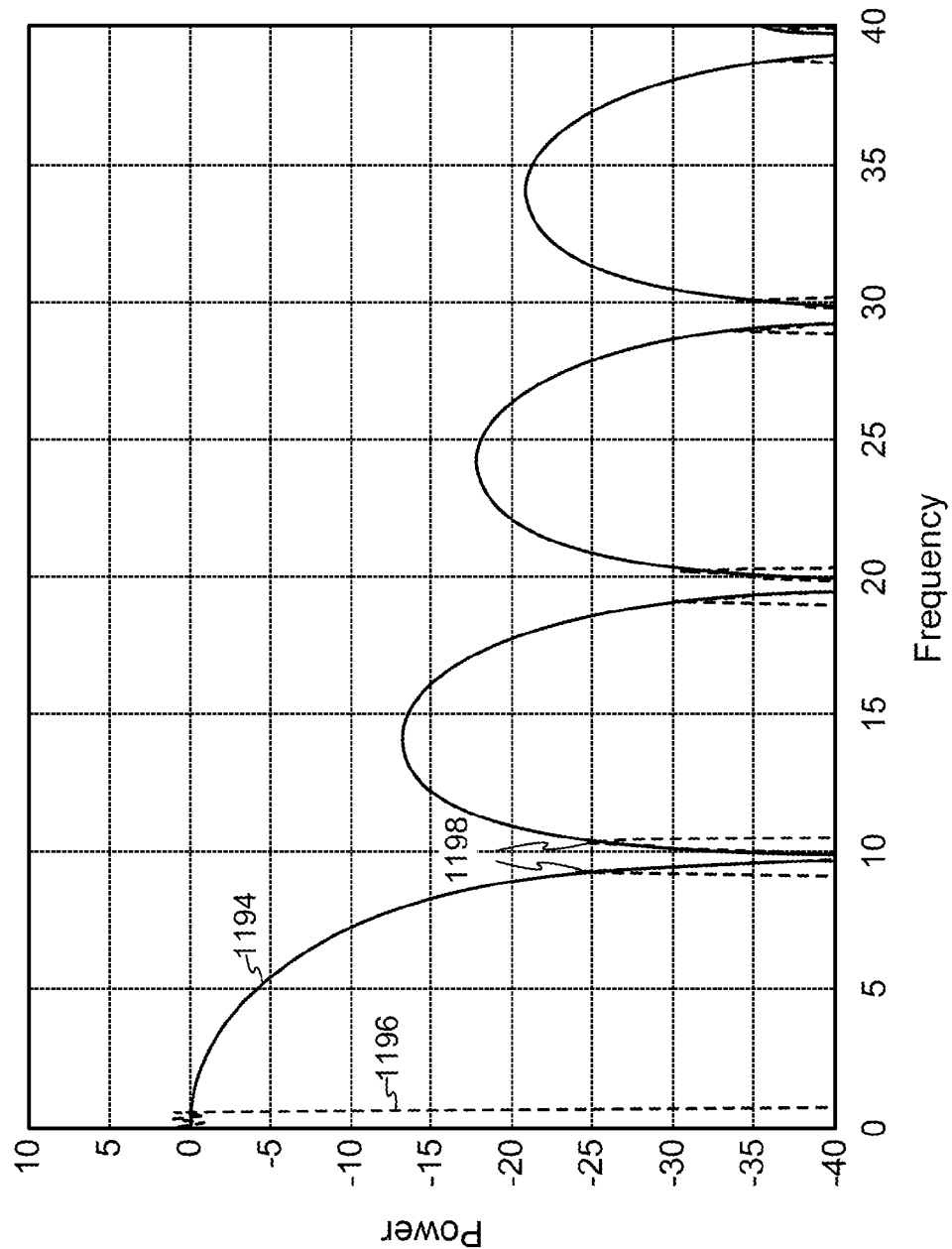
FIG. 11 is a graph illustrating the frequency response of a digital-to-analog converter (DAC) and an output of the digital-to-analog converter (DAC)

FIG. 11 is a graph illustrating the frequency response 1194 of a digital-to-analog converter (DAC) 120 and an output 1196 of the digital-to-analog converter (DAC) 120. The amplitude of the frequency response 1194 may roll off with increasing frequency according to a sinc function $$\left(\text{i.e., } \frac{\sin(\pi x)}{\pi x}\right),$$

leaving "nulls" of very weak image energy around the integer multiples of the sample rate.

The output 1196 of the digital-to-analog converter (DAC) 120 may include DAC images 1198 around the "nulls" of the frequency response 1194. These DAC images 1198 interfere with the primary receiver 122 on the wireless device 102*a*, a secondary receiver 126 on the wireless device 102*a* or a receiver 130 on another wireless device 102*b*.

Figure 12:
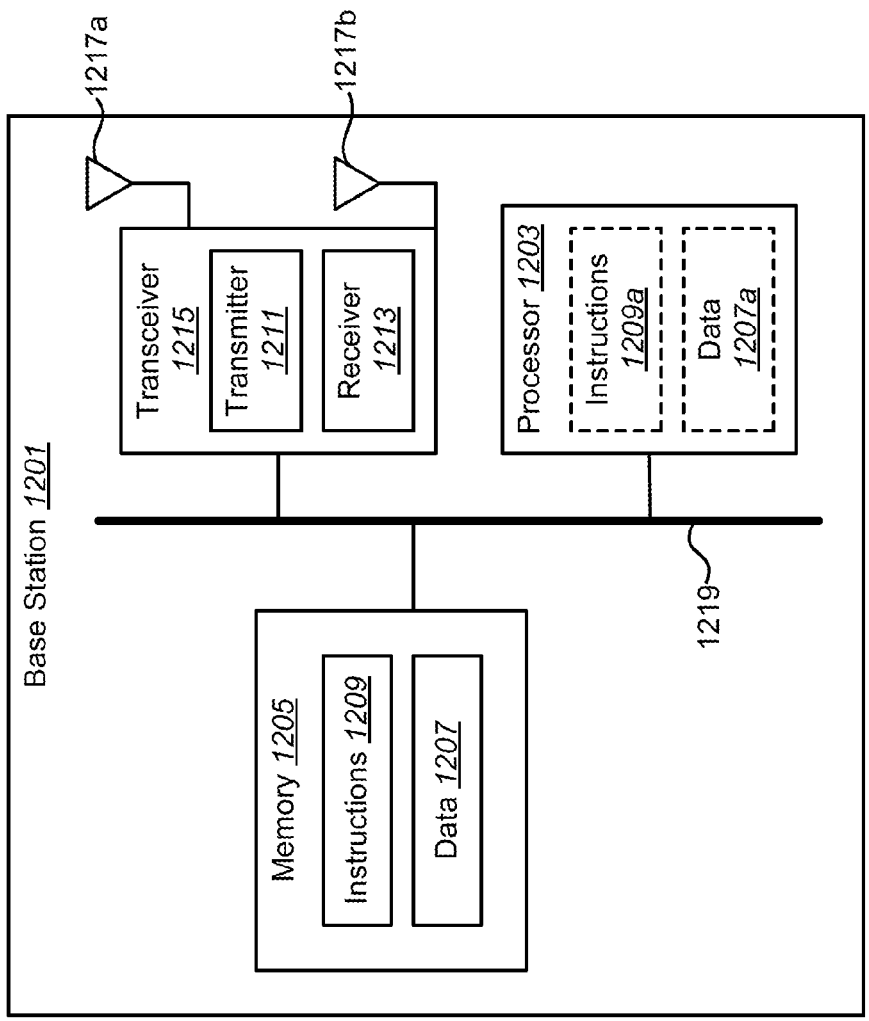
FIG. 12 illustrates certain components that may be included within a base station.

FIG. 12 illustrates certain components that may be included within a base station 1201. The base station 1201 may be an access point, a NodeB, an evolved NodeB, etc. The base station 1201 includes a processor 1203. The processor 1203 may be a general purpose single- or multi-chip microprocessor (e.g., an ARM), a special purpose microprocessor (e.g., a digital signal processor (DSP)), a microcontroller, a programmable gate array, etc. The processor 1203 may be referred to as a central processing unit (CPU). Although just a single processor 1203 is shown in the base station 1201 of FIG. 12, in an alternative configuration, a combination of processors (e.g., an ARM and DSP) could be used.

The base station 1201 also includes memory 1205. The memory 1205 may be any electronic component capable of storing electronic information. The memory 1205 may be embodied as random access memory (RAM), read-only memory (ROM), magnetic disk storage media, optical storage media, flash memory devices in RAM, on-board memory included with the processor, EPROM memory, EEPROM memory, registers, and so forth, including combinations thereof.

Data 1207 and instructions 1209 may be stored in the memory 1205. The instructions 1209 may be executable by the processor 1203 to implement the methods disclosed herein. Executing the instructions 1209 may involve the use of the data 1207 that is stored in the memory 1205. When the processor 1203 executes the instructions 1209, various portions of the instructions 1209a may be loaded onto the processor 1203, and various pieces of data 1207a may be loaded onto the processor 1203.

The base station 1201 may also include a transmitter 1211 and a receiver 1213 to allow transmission and reception of signals to and from the wireless device 1201. The transmitter 1211 and receiver 1213 may be collectively referred to as a transceiver 1215. Multiple antennas 1217a-b may be electrically coupled to the transceiver 1215. The base station 1201 may also include (not shown) multiple transmitters, multiple receivers and/or multiple transceivers.

The various components of the base station 1201 may be coupled together by one or more buses, which may include a power bus, a control signal bus, a status signal bus, a data bus, etc. For the sake of clarity, the various buses are illustrated in FIG. 12 as a bus system 1219.

Figure 13:
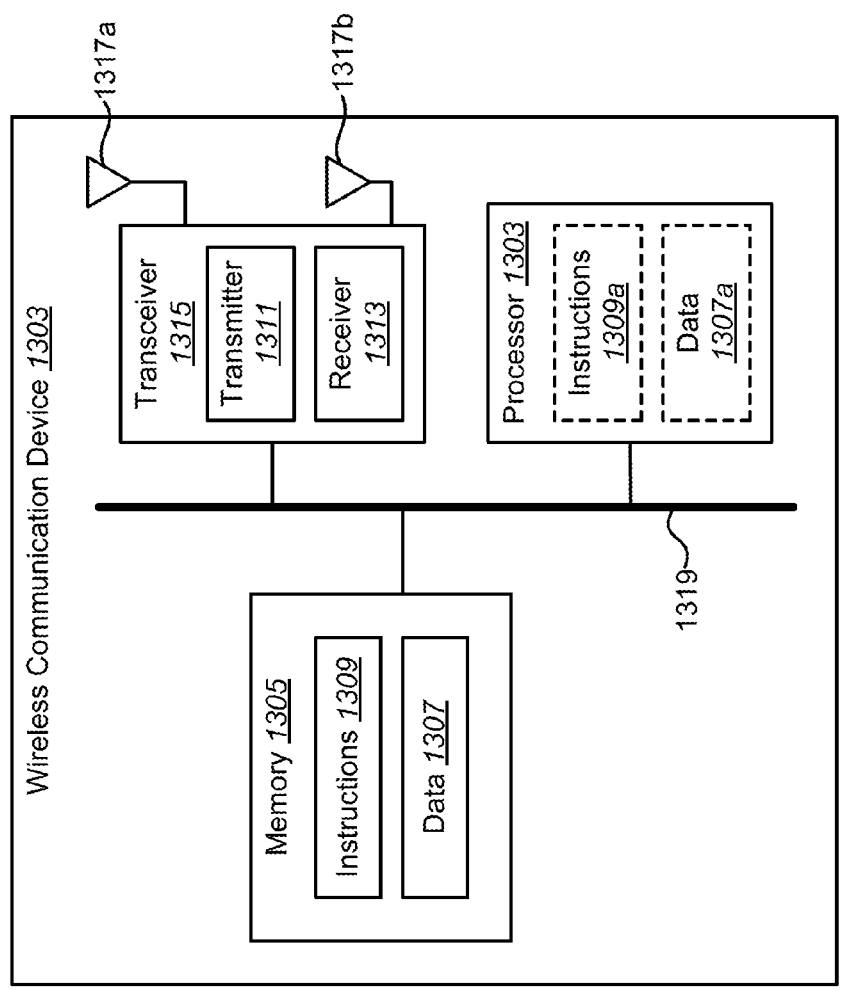
FIG. 13 illustrates certain components that may be included within a wireless communication device.

FIG. 13 illustrates certain components that may be included within a wireless communication device 1303. The wireless communication device 1303 may be an access terminal, a mobile station, a user equipment (UE), etc. The wireless communication device 1303 includes a processor 1303. The processor 1303 may be a general purpose single- or multi-chip microprocessor (e.g., an ARM), a special purpose microprocessor (e.g., a digital signal processor (DSP)), a microcontroller, a programmable gate array, etc. The processor 1303 may be referred to as a central processing unit (CPU). Although just a single processor 1303 is shown in the wireless communication device 1303 of FIG. 13, in an alternative configuration, a combination of processors (e.g., an ARM and DSP) could be used.

The wireless communication device 1303 also includes memory 1305. The memory 1305 may be any electronic component capable of storing electronic information. The memory 1305 may be embodied as random access memory (RAM), read-only memory (ROM), magnetic disk storage media, optical storage media, flash memory devices in RAM, on-board memory included with the processor, EPROM memory, EEPROM memory, registers, and so forth, including combinations thereof.

Data 1307 and instructions 1309 may be stored in the memory 1305. The instructions 1309 may be executable by the processor 1303 to implement the methods disclosed herein. Executing the instructions 1309 may involve the use of the data 1307 that is stored in the memory 1305. When the processor 1303 executes the instructions 1309, various portions of the instructions 1309a may be loaded onto the processor 1303, and various pieces of data 1307a may be loaded onto the processor 1303.

The wireless communication device 1303 may also include a transmitter 1311 and a receiver 1313 to allow transmission and reception of signals to and from the wireless communication device 1303. The transmitter 1311 and receiver 1313 may be collectively referred to as a transceiver 1315. Multiple antennas 1317a-b may be electrically coupled to the transceiver 1315. The wireless communication device 1303 may also include (not shown) multiple transmitters, multiple receivers and/or multiple transceivers.

The various components of the wireless communication device 1303 may be coupled together by one or more buses, which may include a power bus, a control signal bus, a status signal bus, a data bus, etc. For the sake of clarity, the various buses are illustrated in FIG. 13 as a bus system 1319.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read-only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, sub-routines, functions, procedures, etc. "Instructions" and "code" may comprise a single computer-readable statement or many computer-readable statements.

The functions described herein may be implemented in hardware, software, firmware, or any combination thereof. If implemented in software, the functions may be stored as one or more instructions on a computer-readable medium. The terms "computer-readable medium" or "computer-program product" refers to any available medium that can be accessed by a computer. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIGS. 2, 4, 7 and 10, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read-only memory (ROM), a physical storage medium such as a compact disc (CD) or floppy disk, etc.), such that a device may obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A method for interference reduction, the method being implemented in a wireless device, the method comprising:
    beginning a data session call;
    determining that a page is going to be received via a secondary receiver;
    determining that one or more images from a digital-to-analog converter (DAC) in a transmitter will cause interference with the secondary receiver when the page is received; and
    changing a sampling frequency of the DAC for the transmitter in a middle of the data session call so that there are not any DAC images from the transmitter that will cause interference with the secondary receiver,
    wherein the sampling frequency of the DAC is changed in a manner to minimize amplitude and phase transients on a transmit signal.

2. The method of claim 1, wherein the transmitter is an EV-DO (Evolution Data Optimized) transmitter, and wherein the secondary receiver is a CDMA2000 receiver.

3. The method of claim 1, wherein the method is performed when the wireless device is in a middle of an EV-DO (Evolution Data Optimized) data session call.

4. The method of claim 3, wherein a primary receiver is used for the EV-DO data session call.

5. The method of claim 4, wherein the primary receiver is connected to a primary antenna and the secondary receiver is connected to a secondary antenna.

6. The method of claim 4, wherein the transmitter is capable of transmitting in multiple frequency bands, and wherein the primary receiver is capable of receiving in multiple frequency bands.

7. The method of claim 1, wherein the secondary receiver is capable of receiving pages in multiple frequency bands.

8. The method of claim 1, wherein the page is a CDMA2000 page.

9. The method of claim 8, wherein the secondary receiver knows what frequency is going to be used to receive the CDMA2000 page prior to receiving the CDMA2000 page.

10. The method of claim 1, wherein the DAC image causes interference with the secondary receiver by falling on a CDMA2000 receiver paging channel.

11. The method of claim 1, wherein the sampling frequency of the DAC is changed in a manner to minimize amplitude and phase transients on an EV-DO (Evolution Data Optimized) transmit signal.

12. The method of claim 1, wherein the sampling frequency of the DAC is changed so that none of the DAC images fall on either an EV-DO (Evolution Data Optimized) channel or a CDMA2000 paging channel.

13. The method of claim 1, wherein the wireless device supports Simultaneous Hybrid Dual Receiver (SHDR).

14. A wireless device configured for interference reduction, comprising:
    a transmitter;
    a primary receiver;
    a secondary receiver; and
    a controller that is configured to:
        begin a data session call;
        determine that a page is going to be received via a secondary receiver;
        determine that one or more images from a digital-to-analog converter (DAC) in the transmitter will cause interference with the secondary receiver when the page is received; and
        change a sampling frequency of the DAC for the transmitter in a middle of the data session call so that there are not any DAC images from the transmitter that will cause interference with the secondary receiver,
        wherein the sampling frequency of the DAC is changed in a manner to minimize amplitude and phase transients on a transmit signal.

15. The wireless device of claim 14, wherein the transmitter is an EV-DO (Evolution Data Optimized) transmitter, and wherein the secondary receiver is a CDMA2000 receiver.

16. The wireless device of claim 14, wherein the wireless device is in a middle of an EV-DO (Evolution Data Optimized) data session call.

17. The wireless device of claim 16, wherein the primary receiver is used for the EV-DO data session call.

18. The wireless device of claim 14, wherein the primary receiver is connected to a primary antenna and the secondary receiver is connected to a secondary antenna.

19. The wireless device of claim 14, wherein the transmitter is capable of transmitting in multiple frequency bands, and wherein the primary receiver is capable of receiving in multiple frequency bands.

20. The wireless device of claim 14, wherein the secondary receiver is capable of receiving pages in multiple frequency bands.

21. The wireless device of claim 14, wherein the page is a CDMA2000 page.

22. The wireless device of claim 21, wherein the secondary receiver knows what frequency is going to be used to receive the CDMA2000 page prior to receiving the CDMA2000 page.

23. The wireless device of claim 14, wherein the DAC image causes interference with the secondary receiver by falling on a CDMA2000 receiver paging channel.

24. The wireless device of claim 14, wherein the sampling frequency of the DAC is changed in a manner to minimize amplitude and phase transients on an EV-DO (Evolution Data Optimized) transmit signal.

25. The wireless device of claim 14, wherein the sampling frequency of the DAC is changed so that none of the DAC images fall on either an EV-DO (Evolution Data Optimized) channel or a CDMA2000 paging channel.

26. The wireless device of claim 14, wherein the wireless device supports Simultaneous Hybrid Dual Receiver (SHDR).

27. An apparatus configured for interference reduction, comprising:
    means for beginning a data session call;
    means for determining that a page is going to be received via a secondary receiver;
    means for determining that one or more images from a digital-to-analog converter (DAC) in image from a transmitter will cause interference with the secondary receiver when the page is received; and
    means for changing a sampling frequency of the DAC for the transmitter in a middle of the data session call so that there are not any DAC images from the transmitter that will cause interference with the secondary receiver,
    wherein the sampling frequency of the DAC is changed in a manner to minimize amplitude and phase transients on a transmit signal.

28. The apparatus of claim 27, wherein the transmitter is an EV-DO (Evolution Data Optimized) transmitter, and wherein the secondary receiver is a CDMA2000 receiver.

29. The apparatus of claim 25, wherein the apparatus is in a middle of an EV-DO (Evolution Data Optimized) data session call.

30. The apparatus of claim 29, wherein a primary receiver is used for the EV-DO data session call.

31. The apparatus of claim 27, wherein the apparatus supports Simultaneous Hybrid Dual Receiver (SHDR).

32. A computer-program product comprising a non-transitory computer-readable medium having instructions thereon, the instructions comprising:
    code for beginning a data session call;
    code for determining that a page is going to be received via a secondary receiver;
    code determining that one or more images from a digital-to-analog converter (DAC) in image from a transmitter will cause interference with the secondary receiver when the page is received; and
    code for changing a sampling frequency of the DAC for the transmitter in the middle of a data session call so that there are not any DAC images from the transmitter that will cause interference with the secondary receiver,
    wherein the sampling frequency of the DAC is changed in a manner to minimize amplitude and phase transients on a transmit signal.

33. The computer-program product of claim 32, wherein the transmitter is an EV-DO (Evolution Data Optimized) transmitter, and wherein the secondary receiver is a CDMA2000 receiver.

34. The computer-program product of claim 32, wherein the computer-program product is used on a wireless device, and wherein the wireless device is in a middle of an EV-DO (Evolution Data Optimized) data session call.

35. The computer-program product of claim 34, wherein a primary receiver is used for the EV-DO data session call.

* * * * *